United States Patent
Lei et al.

(10) Patent No.: US 9,093,518 B1
(45) Date of Patent: Jul. 28, 2015

(54) SINGULATION OF WAFERS HAVING WAFER-LEVEL UNDERFILL

(71) Applicants: Wei-Sheng Lei, San Jose, CA (US);
James S. Papanu, San Rafael, CA (US);
Brad Eaton, Menlo Park, CA (US);
Ajay Kumar, Cupertino, CA (US)

(72) Inventors: Wei-Sheng Lei, San Jose, CA (US);
James S. Papanu, San Rafael, CA (US);
Brad Eaton, Menlo Park, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/320,390

(22) Filed: Jun. 30, 2014

(51) Int. Cl.
*H01L 21/00* (2006.01)
*H01L 21/78* (2006.01)

(52) U.S. Cl.
CPC ...................................... *H01L 21/78* (2013.01)

(58) Field of Classification Search
CPC ......... H01L 21/78; H01L 21/00; B23K 26/38
USPC .......................... 438/460, 462, 463, 464, 113
See application file for complete search history.

(56) References Cited

U.S. PATENT DOCUMENTS

| | | | |
|---|---|---|---|
| 4,049,944 A | 9/1977 | Garvin et al. | |
| 4,339,528 A | 7/1982 | Goldman | |
| 4,684,437 A | 8/1987 | Donelon et al. | |
| 5,336,638 A | 8/1994 | Suzuki et al. | |
| 5,543,365 A * | 8/1996 | Wills et al. | 438/462 |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Caleb Henry
(74) *Attorney, Agent, or Firm* — Blakely Sokoloff Taylor Zafman LLP (57) ABSTRACT

Methods of dicing semiconductor wafers, each wafer having a plurality of integrated circuits, are described. In an example, a method of dicing a wafer involves providing a semiconductor wafer having integrated circuits on a front side thereof, and having a wafer-level underfill material layer disposed on the integrated circuits. The method also involves laser irradiating the semiconductor wafer from a backside of the semiconductor wafer to generate defects along dicing streets of the semiconductor wafer, the dicing streets oriented between the integrated circuits. The method also involves, subsequent to the laser irradiating, mechanically singulating the integrated circuits along the dicing streets.

26 Claims, 6 Drawing Sheets

(56) References Cited

U.S. PATENT DOCUMENTS

| | | | |
|---|---|---|---|
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,734,083 B2 * | 5/2004 | Kobayashi | 438/462 |
| 6,737,606 B2 * | 5/2004 | Wai et al. | 219/121.68 |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,696,012 B2 * | 4/2010 | Nakamura | 438/114 |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,809,166 B2 * | 8/2014 | Buenning et al. | 438/463 |
| 2002/0031899 A1 * | 3/2002 | Manor | 438/460 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0148211 A1 * | 7/2006 | Iwasaki et al. | 438/462 |
| 2006/0205182 A1 | 9/2006 | Soejima | |
| 2007/0066044 A1 | 3/2007 | Abe et al. | |
| 2007/0105345 A1 * | 5/2007 | Kurosawa | 438/460 |
| 2007/0207594 A1 * | 9/2007 | Tamura | 438/463 |
| 2007/0272668 A1 * | 11/2007 | Albelo et al. | 219/121.72 |
| 2008/0096368 A1 * | 4/2008 | Sakai | 438/473 |
| 2008/0299745 A1 * | 12/2008 | Morikazu | 438/463 |
| 2009/0121337 A1 * | 5/2009 | Abe et al. | 257/686 |
| 2009/0215245 A1 * | 8/2009 | Nakamura | 438/463 |
| 2009/0255911 A1 | 10/2009 | Krishnaswami et al. | |
| 2010/0013036 A1 | 1/2010 | Carey | |
| 2010/0025387 A1 * | 2/2010 | Arai et al. | 219/121.69 |
| 2010/0216313 A1 | 8/2010 | Iwai | |
| 2010/0248451 A1 | 9/2010 | Pirogovsky et al. | |
| 2011/0014777 A1 | 1/2011 | Haji et al. | |
| 2011/0147897 A1 * | 6/2011 | Varela et al. | 257/620 |
| 2011/0298084 A1 | 12/2011 | Tamemoto | 257/507 |
| 2011/0312157 A1 * | 12/2011 | Lei et al. | 438/462 |
| 2012/0108035 A1 * | 5/2012 | Kim et al. | 438/463 |
| 2012/0156816 A1 * | 6/2012 | Okamura et al. | 438/33 |
| 2012/0196426 A1 * | 8/2012 | Lim | 438/460 |
| 2012/0322239 A1 * | 12/2012 | Singh et al. | 438/462 |
| 2012/0329246 A1 * | 12/2012 | Finn | 438/462 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0280890 A1 * | 10/2013 | Lei et al. | 438/463 |
| 2014/0015109 A1 * | 1/2014 | Lei et al. | 257/618 |
| 2014/0017879 A1 * | 1/2014 | Chowdhury et al. | 438/462 |
| 2014/0017882 A1 * | 1/2014 | Lei et al. | 438/465 |
| 2014/0054797 A1 * | 2/2014 | Gong (Tony) et al. | 257/777 |
| 2014/0106542 A1 * | 4/2014 | Chowdhury et al. | 438/462 |
| 2014/0154871 A1 * | 6/2014 | Hwang et al. | 438/463 |
| 2014/0179084 A1 * | 6/2014 | Lei et al. | 438/463 |
| 2014/0213041 A1 * | 7/2014 | Lei et al. | 438/462 |
| 2014/0213043 A1 * | 7/2014 | Van Der Stam | 438/463 |
| 2014/0252375 A1 * | 9/2014 | Briere | 257/77 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Yang, Kate, "The application of stealth dicing in the field of smart card", Chins Integrated Circuit (CIC), No. 3, 2013, pp. 54-56, http://cicmag.com.

"Stealth Dicing Technology and Applications", Technical Information Bulletin, Hamamatsu, Mar. 2005.

Chen, W. T., et al., "Processing TSV wafer with stealth dicing technology", IEEE Catalog No. CFP1259B-ART, pp. 271-273, 2012.

Kumagai, M., et al., "Advanced Dicing Technology for Semiconductor Wafer", IEEE. Trans. Semi. Manuf., 20, pp. 259-265, 2007.

* cited by examiner

SINGULATION OF WAFERS HAVING WAFER-LEVEL UNDERFILL

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a wafer involves providing a semiconductor wafer having integrated circuits on a front side thereof, and having a wafer-level underfill material layer disposed on the integrated circuits. The method also involves laser irradiating the semiconductor wafer from a backside of the semiconductor wafer to generate defects along dicing streets of the semiconductor wafer, the dicing streets oriented between the integrated circuits. The method also involves, subsequent to the laser irradiating, mechanically singulating the integrated circuits along the dicing streets.

In another embodiment, a method of dicing a wafer involves providing a silicon wafer having integrated circuits on a front side thereof, and having a wafer-level underfill material layer disposed on the integrated circuits. The method also involves mounting a backside of the silicon wafer on a dicing tape of a substrate carrier. The method also involves laser irradiating the silicon wafer from the backside, through the dicing tape, to generate defects along dicing streets of the silicon wafer, the dicing streets oriented between the integrated circuits. The method also involves, subsequent to the laser irradiating, mechanically singulating the integrated circuits along the dicing streets.

In another embodiment, a method of dicing a wafer involves providing a silicon wafer having integrated circuits on a front side thereof, and having a wafer-level underfill material layer disposed on the integrated circuits. The method also involves mounting, via the wafer-level underfill material layer, the silicon wafer on a dicing tape of a substrate carrier. The method also involves laser irradiating the silicon wafer from a backside of the silicon wafer to generate defects along dicing streets of the silicon wafer, the dicing streets oriented between the integrated circuits. The method also involves, subsequent to the laser irradiating, mechanically singulating the integrated circuits along the dicing streets.

DETAILED DESCRIPTION

Methods of dicing semiconductor wafers, each wafer having a plurality of integrated circuits thereon, are described. In the following description, numerous specific details are set forth, such as stealth dicing approaches and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A stealth wafer or substrate dicing process involving laser irradiation and subsequent mechanical separation may be implemented for die singulation. The laser irradiation process is used to generate laser-induced defects in the wafer or substrate along a dicing lane. A mechanical separation based on application of tensile stress may then be used to crack the wafer or substrate along the dicing lane, as aided by the laser-induced defects. In an embodiment, wafers including a wafer level underfill material thereon are subjected to such a stealth dicing process. In one such embodiment, the wafers are first scribed in the dicing lanes by a laser scribing process. The laser scribing process may be used to cleanly remove the wafer level underfill material and/or and device layers present in the dicing lane.

One or more embodiments described herein are directed to stealth dicing of wafers having a wafer-level underfill material included therewith. Some embodiments are directed to the singulation or dicing of die on a semiconductor wafer in preparation for device packaging. More specifically, particular embodiments may pertain to die singulation of thin wafers having a wafer level underfill included thereon for three-dimensional (3D) stacking/packaging applications.

To provide context, as part of the device packaging process, singulated die are placed onto printed circuit boards (PCBs) and stacked on top of each other in multiple die packages. In order to dissipate the thermomechanical mismatch between the die and substrate an "underfill" material is placed in the PCB-die and die-to-die gaps. Currently, the underfill material is applied to each individual die stack. However, wafer-level underfill (WLUF) has recently become economically and technically feasible to replace conventional die-level dispensing of an underfill material. As the name implies, the underfill is applied to the entire wafer in a single application (e.g., by lamination, coating, or screen printing), and is thus applied prior to die stacking rather than after die stacking However, to date, no proven technology has been adopted for dicing of wafers with wafer level underfill.

Figure 1:
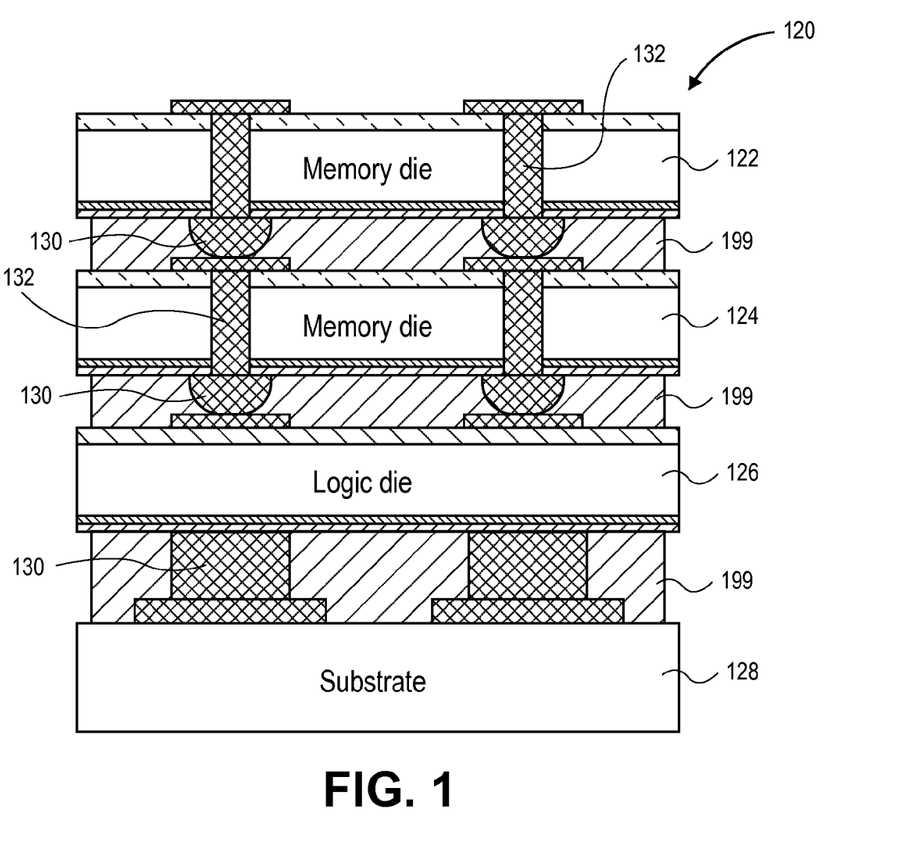
FIG. 1 illustrates a cross-sectional view of a stack of dies as coupled to a package substrate, in accordance with an embodiment of the present invention.

It is to be appreciated that processes described herein can be used to accommodate fabrication of a variety of 3D architectures. In an example, FIG. 1 illustrates a cross-sectional view of a stack of dies as coupled to a package substrate, in accordance with an embodiment of the present invention. Referring to FIG. 1, a logic die/memory die hybrid 3D stacking structure 120 includes a first memory die 122 coupled to a second memory die 124. The second memory die 124 is coupled to a logic die 126. The logic die 126 is coupled to a package substrate 128. As depicted in FIG. 1, the coupling can be effected by use of backside bumps 130 and through-silicon-vias (TSVs) 132. As is also depicted in FIG. 1, an underfill material 199 may be included between substrate/die, or die/die pairings in final products as a passivation layer.

In accordance with an embodiment of the present invention, in preparation for die singulation, wafers (typically thinned, but could be full thickness) are mounted onto flexible dicing tape and supported by a rigid frame. When a full wafer level underfill (WLUF) is used, this layer is applied in a separate series of operations. The wafers with WLUF are then mounted onto the dicing tape with either the WLUF face up or face down onto the tape, as is described in greater detail below in association with FIGS. 2A and 2B. The wafers are then singulated.

Traditionally, wafers have been singulated using mechanical saw dicing. With the implementation of advanced dielectric materials and packaging techniques (requiring thinned wafers), however, new singulation technologies have been developed such as laser grooving-plus-saw, laser ablative full cut dicing, laser stealth dicing, lithographic patterning-plus-plasma dicing, and laser ablation-plus-plasma dicing. Conceptually, stealth dicing (SD) includes two operations. First, a laser beam is focused inside of the wafer to generate localized defects along the central axis of the dicing lane. Next, tensile stress is applied on the dicing tape to propagate a crack along the line of localized defects in the SD layer, e.g., along the stealth dicing direction, to singulate dies.

With the newly developed WLUF technology, in which the underfill layer is applied on the device side of whole wafer surface prior to wafer dicing, conventional blade dicing and/or full thickness laser ablative dicing have difficulty to cleanly cut the wafer. In accordance with one or more embodiments described herein, however, a stealth dicing like approach is used for singulation of a wafer with WLUF already formed thereon. Again, as described below in association with FIGS. 2A and 2B, there are two options by which the wafer can be prepared for stealth dicing. In particular, considerations must be made depending upon whether the WLUF is face up or face down against the dicing tape.

As further described below, in an embodiment, within each option of WLUF being face up or face down against the dicing tape, there are two sub-options in which (i) the WLUF (and device layers in the streets) are not removed or (ii) the WLUF is removed alone or together with device layers in the streets by mechanical sawing and/or laser ablation prior to stealth dicing laser irradiation. With respect to at least some embodiments described below, the WLUF material can or should be removed if the WLUF is opaque. For example, preventing wafer misalignment for dicing or precision separation of WLUF along dicing trench can become difficult during stealth dicing in the case of an opaque WLUF material. With respect to at least some embodiments described below, device layers underneath a WLUF layer can or should be removed in order to more precisely control crack propagation of stealth dicing-generated embedded cracks along the dicing direction using a laser scribed kerf as guidance. This may particularly useful when there exists a TSV in the trench.

Figure 2A:
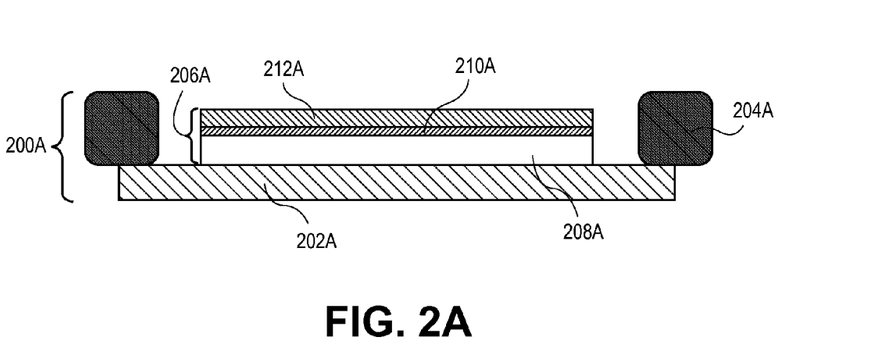
FIG. 2A illustrates a cross-sectional view of a substrate carrier supporting a wafer having a wafer level underfill material thereon in a device-side-up arrangement, in accordance with an embodiment of the present invention.
Figure 2B:
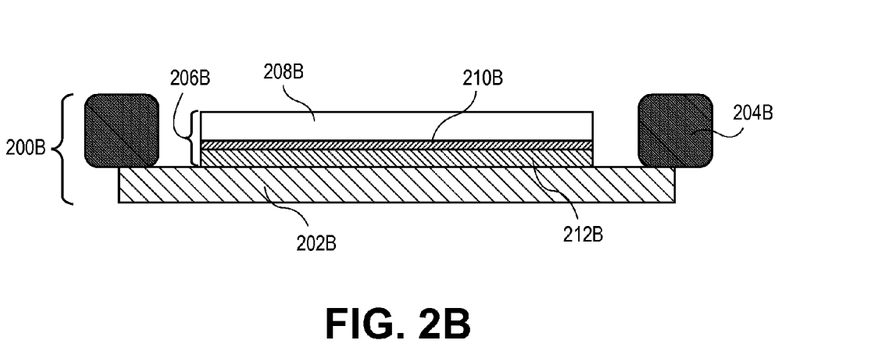
FIG. 2B illustrates a cross-sectional view of a substrate carrier supporting a wafer having a wafer level underfill material thereon in a device-side-down arrangement, in accordance with an embodiment of the present invention.

FIGS. 2A and 2B described below show two possible arrangements for a wafer supported by a substrate carrier (e.g., tape frame), the wafer having a WLUF material thereon.

In a first example, FIG. 2A illustrates a cross-sectional view of a substrate carrier supporting a wafer having a wafer level underfill material thereon in a device-side-up arrangement, in accordance with an embodiment of the present invention. Referring to FIG. 2A, a substrate carrier 200A includes a dicing tape 202A supported by metal frame 204A. A wafer 206A includes a wafer substrate 208A with device layers 210A on a front side thereof. A WLUF material layer 212A is disposed on the device layers 210A. In the arrangement of FIG. 2A, the wafer 206A is oriented relative to the substrate carrier 200A such that the WLUF layer 212A is face-up. That is, the WLUF layer 212A and the device layers 210A are above the substrate 208A which is disposed on the dicing tape 202A.

In a second example, FIG. 2B illustrates a cross-sectional view of a substrate carrier supporting a wafer having a wafer level underfill material thereon in a device-side-down arrangement, in accordance with an embodiment of the present invention. Referring to FIG. 2B, a substrate carrier 200B includes a dicing tape 202B supported by metal frame 204B. A wafer 206B includes a wafer substrate 208B with device layers 210B on a front side thereof. A WLUF material layer 212B is disposed on the device layers 210B. In the arrangement of FIG. 2B, the wafer 206B is oriented relative to the substrate carrier 200B such that the WLUF layer 212B is face-down. That is, the WLUF layer 212B and the device layers 210B are below the substrate 208B. The WLUF material layer 212B is disposed on the dicing tape 202B.

Figure 3:
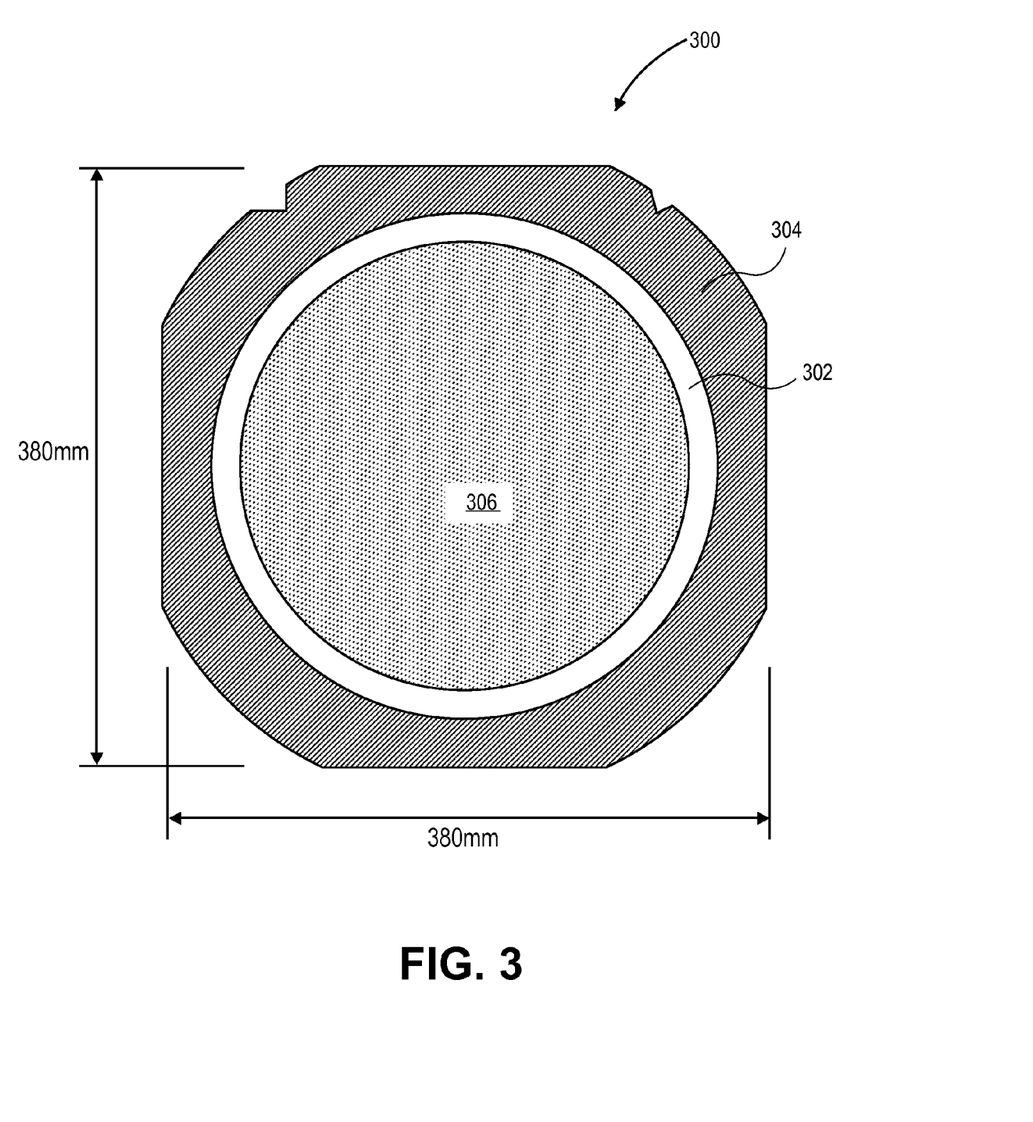
FIG. 3 illustrates a plan view of a substrate carrier suitable for supporting a wafer during a singulation process, in accordance with an embodiment of the present invention.

It is to be appreciated that wafer substrate and substrate carrier sizing may vary by application. As one such example, FIG. 3 illustrates a plan view of a substrate carrier suitable for supporting a wafer during a singulation process, in accordance with an embodiment of the present invention. Referring to FIG. 3, a substrate carrier 300 includes a layer of backing tape 302 surrounded by a tape ring or frame 304. A wafer or substrate 306 is supported by the backing tape 302 of the substrate carrier 500. In one embodiment, the wafer or substrate 306 is attached to the backing tape 302 by a die attach film. In one embodiment, the tape ring or frame 304 is composed of stainless steel.

In an embodiment, a singulation process can be accommodated in a single system (e.g., a cluster tool) or in a plurality of stand-alone systems sized to receive a substrate carrier such as the substrate carrier 300. In one such embodiment, such a system can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 200 or 450 millimeter wafers or substrates or, more particularly, substrate carriers sized to support 200 or 450 millimeter wafers or substrates.

In an embodiment, semiconductor wafer or substrate 208A, 208B or 306 is composed of a material suitable to withstand a fabrication process and upon which semiconductor processing layers may suitably be disposed. For example, in one embodiment, semiconductor wafer or substrate 208A, 208B or 306 is composed of a group IV-based material such as, but not limited to, crystalline silicon, germanium or silicon/germanium. In a specific embodiment, providing semiconductor wafer or substrate 208A, 208B or 306 includes providing a monocrystalline silicon substrate. In a particular embodiment, the monocrystalline silicon substrate is doped with impurity atoms. In another embodiment, semiconductor wafer or substrate 208A, 208B or 306 is composed of a III-V material such as, e.g., a III-V material substrate used in the fabrication of light emitting diodes (LEDs).

In an embodiment, the semiconductor wafer or substrate 208A, 208B or 306 has disposed thereon or therein, as a portion of integrated circuits included thereon or therein, an array of semiconductor devices, i.e., fabricated in device layers 210A or 210B. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Materials making up the streets or lanes between integrated circuits may be similar to or the same as those materials used to form the integrated circuits. For example, the streets or lanes may be composed of layers of dielectric materials, semiconductor materials, and metallization. In one embodiment, one or more of the streets or lanes includes test devices similar to the actual devices of the integrated circuits.

Wafer-level underfill (WLUF) material layer may be composed of a material suitable for inclusion on the top of the chips (device side) in a stack of chips to create a thermal short and also to provide a mechanically stable connection between the stacked chips. Such an under-fill material should generally have (1) very low electrical conductivity, (2) high thermal conductivity, (3) coefficient of thermal expansion closely matched to the chip bulk material e.g. silicon, (4) good adhesion to the various passivation layers and molding compounds that are used on the tops and bottoms of the chips e.g. silicon nitrides, oxides, polyimides, and (5) advantageous rheology allowing formability around the topology of the pillars and bumps found on the device side of the chip without leaving voids. Examples of suitable commercially available materials for the underfill layer include B-staged epoxy such as Intervia™ or Cyclotene™ both by Dow Chemical, polyimides such as Pimel™ available from Asahi KASEI, polybenzoxazoles such as Sumiresin™ available from Sumitomo Bakelite. Many other materials are also available.

Providing further context, previous approaches for applying an under-fill layer have included: (1) capillary action flow of an under-fill curable liquid between two chips of the already assembled stack, (2) application of a "hot melt" material to the top or bottom of a chip prior to stacking which flows when heated, and (3) application of a dry laminate to the top of the finished chip prior to stacking. However, the capillary action flow approach often encounters difficulties in balancing the required wettability of the chip/flow material interface against the force that the capillary action places on the thinned and very delicate chips. Meanwhile, hot melt approaches are still being investigated and have not been optimized. A conventional dry laminate approach involves application of a dry film to the top of the finished chip prior to stacking, but following singulation. Use of a WLUF material may overcome as least some of the above listed issues common to post singulation application of an underfill material.

By contrast, in accordance with one or more embodiments described herein, "wafer level underfill" is achieved by physically rolling a bilayer tape onto the surface of a wafer prior to dicing whereby the bottom layer of the bilayer tape flows around the copper bumps and pillars and the top layer acts as a carrier and is peeled away. A reveal process may be performed prior to or subsequent to the singulation process, where the laminate is thinned from the top, e.g., by plasma ashing, to reveal the contact areas of the bumps. In other embodiments, a single layer WLUF material is applied and is recessed prior to or subsequent to the singulation process.

Figure 4:
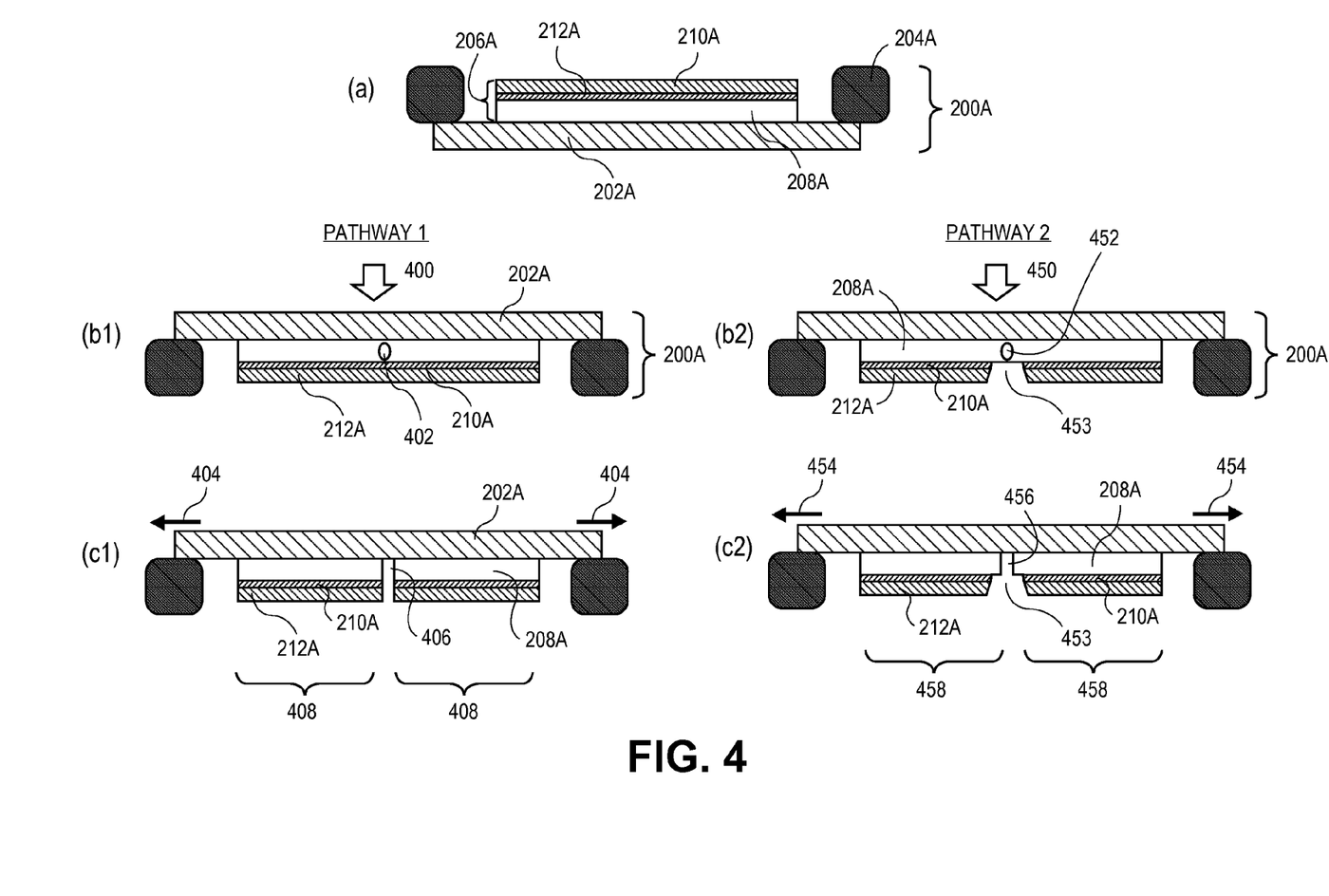
FIG. 4 illustrates cross-sectional views of various stages of processing for two different stealth dicing approaches for the assembly of FIG. 2A, in accordance with an embodiment of the present invention.

In a first example of methodologies described herein, FIG. 4 illustrates cross-sectional views of various stages of processing for two different stealth dicing approaches for the assembly of FIG. 2A, in accordance with an embodiment of the present invention. Referring generally to FIG. 4, in an embodiment, a substrate carrier supporting a wafer having a wafer level underfill material thereon is provided in a device-side-up arrangement. That is, the wafer is provided having the wafer backside mounted on a dicing tape. Stealth dicing of the wafer is performed with laser irradiation from the dicing tape side. In this case, a laser-transparent dicing tape is implemented. Following stealth dicing, the dicing tape is expanded to separate dies subsequent to laser irradiation. For both Pathways 1 and 2 of FIG. 4, described in greater detail below, the starting orientation (a) of the substrate to the substrate carrier is face-up, as was described in association with FIG. 2A.

Pathway 1 of FIG. 4 represents a processing scheme where stealth dicing laser irradiation is employed without removal/patterning of WLUF 212A and/or device layers 210A. Referring to part (b1) of FIG. 4, laser irradiation 400 is performed through dicing tape 202A of substrate carrier 200A. Laser induced defects 402 are generated inside of the wafer substrate 208A along a dicing lane. Referring to part (c1) of FIG. 4, tensile stress 404 is applied along dicing tape 202A. Crack 406 propagation along the defect 402 singulates the dies. That is, the crack 406 goes through WLUF 212A, device layers 210A and substrate 208A to provide singulated dies 408.

Pathway 2 of FIG. 4 represents a processing scheme where stealth dicing laser irradiation is employed with first removal/patterning of WLUF 212A and/or device layers 210A. Referring to part (b2) of FIG. 4, the wafer level underfill 212A and device layers 210A are removed along dicing lane 453. Such removal or scribing may be performed by blade cutting or, preferably, by a laser scribing process, as described in greater detail below. Laser irradiation 450 is performed through dicing tape 202A of substrate carrier 200A. Laser induced defects 452 are generated inside of the wafer substrate 208A along the dicing lane 453. Referring to part (c2) of FIG. 4, tensile stress 454 is applied along dicing tape 202A. Crack 456 propagation along the defect 452 singulates the dies. That is, the crack 456 goes through substrate 208A and aligns with the scribed dicing lane 453 to provide singulated dies 458.

Thus, in accordance with an embodiment of the present invention, FIG. 4 illustrates process flows for a wafer mounted face-up on a tape frame. The laser wavelengths used for stealth dicing cannot penetrate the metal containing device layers in test element groups (TEGs) in the streets. Consequently, the wafer must be irradiated from the backside, through the dicing tape as shown. Pathway 1 corresponds to the case where the WLUF and TEGs/device layers in the streets are not removed prior to stealth dicing laser irradiation, and Pathway 2 corresponds to the case where the WLUF and TEGs/device layers have been removed prior to stealth dicing. For both cases, tensile stress is applied after stealth dicing in order to singulate the dies.

Figure 5:
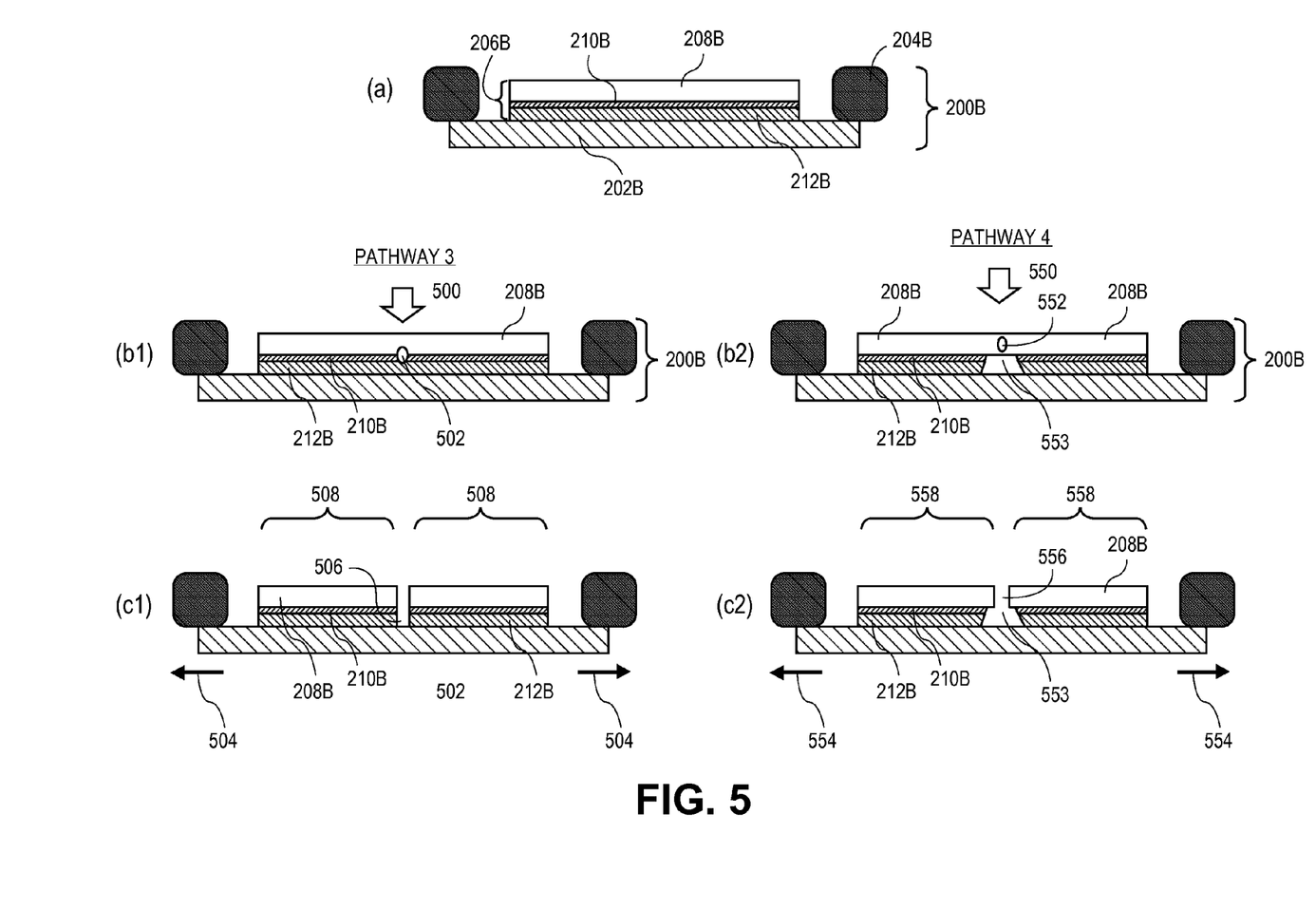
FIG. 5 illustrates cross-sectional views of various stages of processing for two different stealth dicing approaches for the assembly of FIG. 2B, in accordance with an embodiment of the present invention.

In a second example of methodologies described herein, FIG. 5 illustrates cross-sectional views of various stages of processing for two different stealth dicing approaches for the assembly of FIG. 2B, in accordance with an embodiment of the present invention. Referring generally to FIG. 5, in an embodiment, a substrate carrier supporting a wafer having a wafer level underfill material thereon is provided in a device-side-down arrangement. That is, the wafer is provided having the WLUF side of the wafer mounted on a dicing tape. Stealth dicing of the wafer is performed with laser irradiation from the wafer backside. Following stealth dicing, the dicing tape is expanded to separate dies subsequent to laser irradiation. For both Pathways 3 and 4 of FIG. 5, described in greater detail below, the starting orientation (a) of the substrate to the substrate carrier is face-down, as was described in association with FIG. 2B.

Pathway 3 of FIG. 5 represents a processing scheme where stealth dicing laser irradiation is employed without removal/patterning of WLUF 212B and/or device layers 210B. Referring to part (b1) of FIG. 5, laser irradiation 500 is performed from above the exposed backside of the substrate 208B. Laser induced defects 502 are generated inside of the wafer substrate 208B along a dicing lane. Referring to part (c1) of FIG. 5, tensile stress 504 is applied along dicing tape 202B. Crack 506 propagation along the defect 502 singulates the dies. That is, the crack 506 goes through WLUF 212B, device layers 210B and substrate 208B to provide singulated dies 508.

Pathway 4 of FIG. 5 represents a processing scheme where stealth dicing laser irradiation is employed with first removal/patterning of WLUF 212B and/or device layers 210B. Referring to part (b2) of FIG. 5, the wafer level underfill 212B and device layers 210B are removed along dicing lane 553. Such removal or scribing may be performed by blade cutting or, preferably, by a laser scribing process, as described in greater detail below. Laser irradiation 550 is performed from above the exposed backside of the substrate 208B. Laser induced defects 552 are generated inside of the wafer substrate 208B along the dicing lane 553. Referring to part (c2) of FIG. 5, tensile stress 554 is applied along dicing tape 202B. Crack 556 propagation along the defect 552 singulates the dies. That is, the crack 556 goes through substrate 208B and aligns with the scribed dicing lane 553 to provide singulated dies 558.

Thus, in accordance with an embodiment of the present invention, FIG. 5 illustrates process flows for a wafer mounted face-down on a tape frame, e.g., where the WLUF material is mounted on the dicing tape. For these process flows, the stealth dicing laser irradiation must still be from the backside of the wafer. However, since the WLUF is face down, the irradiation is from the top of the tape frame and does not need to pass through the dicing tape. In these approaches, limitations on the stealth dicing laser interaction with the dicing tape are relieved. However, it is to be appreciated that such processing introduces additional process flow complexity since the die orientation after singulation is face down. Pathway 3 corresponds to the case where the WLUF and TEGs/device layers in the streets are not removed prior to stealth dicing laser irradiation, and Pathway 4 corresponds to the case where the WLUF and TEGs/device layers have been removed prior to stealth dicing. For both cases, tensile stress is applied after stealth dicing in order to singulate the dies.

In an embodiment, for all processing possibilities described in association with FIGS. 4 and 5, tensile stress is applied after stealth dicing laser irradiation in order to singulate the dies. Such singualtion may be cleaner that, say, mechanical blade dicing or laser ablative dicing which may each have issues with making clean cuts for a wafer including a WLUF material. Furthermore, plasma dicing may not be cost effective, and the fillers typically used in many types of underfill materials, including WLUF, can present additional integration challenges for plasma dicing approaches. Thus, in accordance with an embodiment of the present invention, stealth dicing is used to provide clean cleavage and resulting side wall generation.

Referring again to FIGS. 4 and 5, it is to be appreciated that a wide variety of laser options may be available for laser irradiation for defect generation during the stealth dicing (SD) portion of the processing schemes. In one particular embodiment, however, laser irradiation for defect generation is performed using a laser beam focused inside the substrate (e.g., inside the bulk silicon portion of the wafer), where the laser used to provide the laser beam has a wavelength greater than approximately 1000 nanometers and a laser pulse width greater than or equal to approximately 10 picoseconds.

Referring again to Pathways 2 and 4 of FIGS. 4 and 5, respectively, the initial removal/patterning of the WLUF and the device layers in the wafer streets or lanes is performed by a laser scribing process. In an embodiment, initial removal/ patterning of the WLUF and the device layers in the wafer streets or lanes with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the WLUF, the device layers and, possibly, a portion of the underlying semiconductor wafer or substrate.

In an embodiment, parameters for a femtosecond laser-based process may be selected to have an essentially common ablation effect on the WLUF and device layers even though the general energy absorption characteristics of such materials may differ widely under certain conditions. In one such embodiment, a high intensity and short pulse width femtosecond-based laser process is used. In a specific embodiment, pulses of approximately less than or equal to 400 femtoseconds are used in a femtosecond-based laser irradiation process to remove the WLUF and device layers in the wafer streets or lanes.

By contrast, if non-optimal laser parameters are selected, in a stacked structure that involves the WLUF and device layers, a laser ablation process may cause delamination issues. For example, a laser penetrate through high bandgap energy dielectrics without measurable absorption. In an embodiment, while picoseconds-based laser irradiation processes lead to microcracking and delaminating in complex stacks, femtosecond-based laser irradiation processes have been demonstrated to not lead to microcracking or delamination of the same material stacks.

In accordance with an embodiment of the present invention, suitable femtosecond-based laser processes for initial removal/patterning of the WLUF and the device layers in the wafer streets or lanes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process for initial removal/patterning of the WLUF and the device layers in the wafer streets or lanes runs along a work piece surface at a speed approximately in the range of 500 mm/sec to 5 m/sec, although preferably approximately in the range of 600 mm/sec to 2 m/sec.

The scribing process for initial removal/patterning of the WLUF and the device layers in the wafer streets or lanes may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Parameters may be selected to provide meaningful process throughput for initial removal/patterning of the WLUF and the device layers in the wafer streets or lanes with precisely controlled ablation width (e.g., kerf width) and depth. As described above, a femtosecond-based laser may be far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with a process tool used for performing one or more of the above described process operations. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
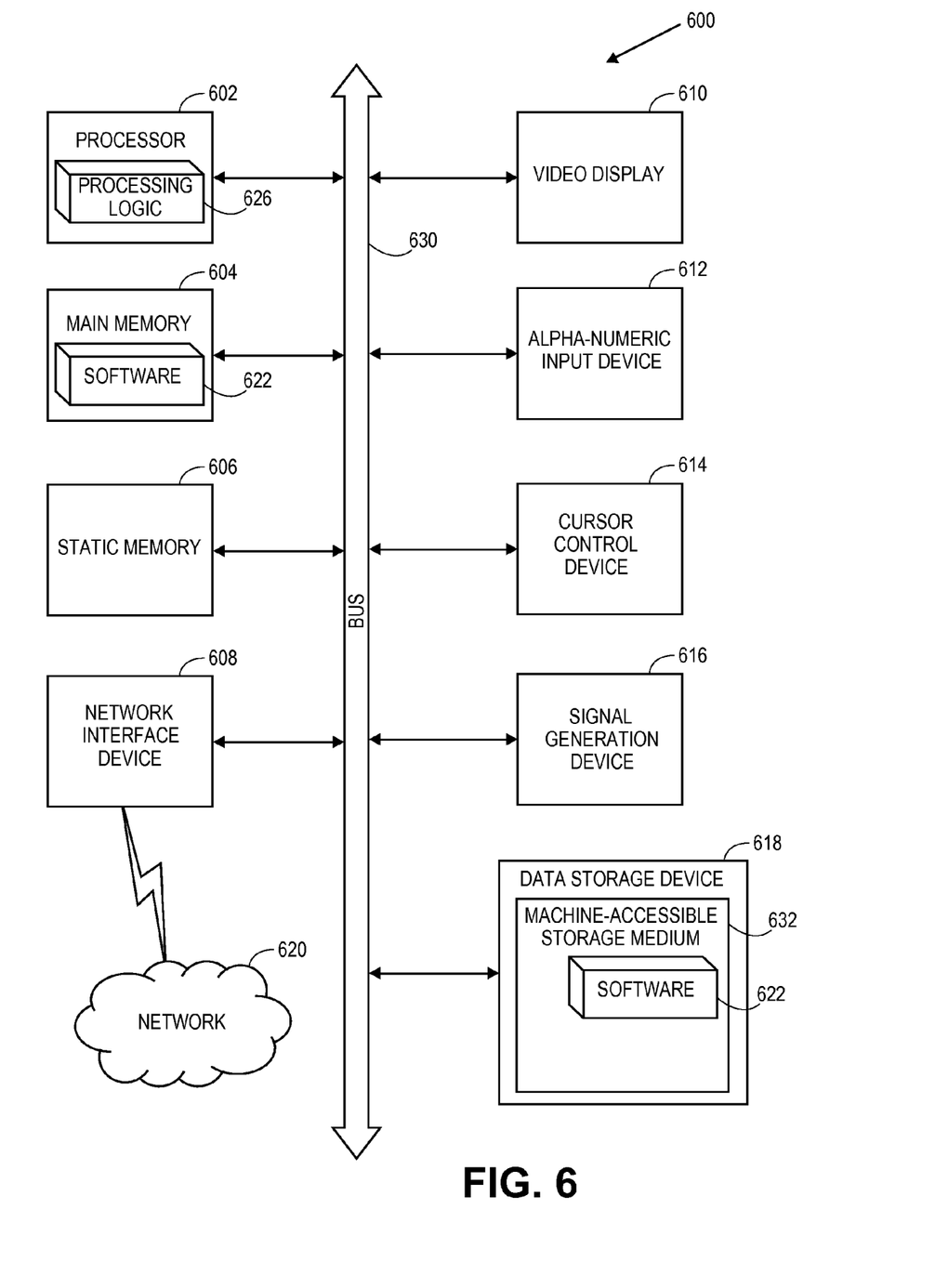
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform an above described method or a portion of an above described method of dicing a wafer or substrate in a fab or other manufacturing environment.

Thus, methods of dicing semiconductor wafers, each wafer having a plurality of integrated circuits, have been disclosed.

What is claimed is:

1. A method of dicing a wafer, the method comprising:
providing a semiconductor wafer having integrated circuits on a front side thereof, and having a wafer-level underfill material layer disposed on the integrated circuits;
laser irradiating the semiconductor wafer from a backside of the semiconductor wafer to generate defects along dicing streets of the semiconductor wafer, the dicing streets oriented between the integrated circuits, wherein laser irradiating the semiconductor wafer from the backside comprises using a laser beam having a wavelength greater than approximately 1000 nanometers and a laser pulse width greater than or equal to approximately 10 picoseconds; and
subsequent to the laser irradiating, mechanically singulating the integrated circuits along the dicing streets.

2. The method of claim 1, wherein a portion of the wafer-level underfill material layer is retained on each of the singulated integrated circuits for subsequent die stacking processing.

3. The method of claim 1, wherein providing the semiconductor wafer comprises providing a single crystalline silicon substrate.

4. The method of claim 1, wherein mechanically singulating the integrated circuits along the dicing streets comprises applying a tensile stress on the semiconductor wafer.

5. The method of claim 1, further comprising:
prior to mechanically singulating the integrated circuits, laser scribing the wafer-level underfill material layer from the front side of the semiconductor wafer, the laser scribing aligned with the dicing streets.

6. The method of claim 5, wherein the laser scribing further comprises scribing device layers formed between the semiconductor wafer and the wafer-level underfill material layer.

7. The method of claim 5, wherein the laser scribing is performed prior to the laser irradiating.

8. The method of claim 5, wherein the laser scribing comprises using a laser having a pulse width in the femtosecond range.

9. A method of dicing a wafer, the method comprising:
providing a silicon wafer having integrated circuits on a front side thereof, and having a wafer-level underfill material layer disposed on the integrated circuits;
mounting a backside of the silicon wafer on a dicing tape of a substrate carrier;
laser irradiating the silicon wafer from the backside, through the dicing tape, to generate defects along dicing streets of the silicon wafer, the dicing streets oriented between the integrated circuits; and
subsequent to the laser irradiating, mechanically singulating the integrated circuits along the dicing streets.

10. The method of claim 9, wherein a portion of the wafer-level underfill material layer is retained on each of the singulated integrated circuits for subsequent die stacking processing.

11. The method of claim 9, wherein the dicing tape is at least mostly transparent to the laser irradiating.

12. The method of claim 9, wherein laser irradiating the silicon wafer from the backside comprises using a laser beam having a wavelength greater than approximately 1000 nanometers and a laser pulse width greater than or equal to approximately 10 picoseconds.

13. The method of claim 9, wherein mechanically singulating the integrated circuits along the dicing streets comprises applying a tensile stress on the silicon wafer by stretching the dicing tape of the substrate carrier.

14. The method of claim 9, further comprising:
prior to laser irradiating the silicon wafer, laser scribing the wafer-level underfill material layer and device layers formed between the silicon wafer and the wafer-level underfill material layer, the laser scribing performed from the front side of the silicon wafer, and the laser scribing aligned with the dicing streets, wherein the laser scribing comprises using a laser having a pulse width in the femtosecond range.

15. A method of dicing a wafer, the method comprising:
providing a silicon wafer having integrated circuits on a front side thereof, and having a wafer-level underfill material layer disposed on the integrated circuits;
mounting, via the wafer-level underfill material layer, the silicon wafer on a dicing tape of a substrate carrier;
laser irradiating the silicon wafer from a backside of the silicon wafer to generate defects along dicing streets of the silicon wafer, the dicing streets oriented between the integrated circuits; and
subsequent to the laser irradiating, mechanically singulating the integrated circuits along the dicing streets.

16. The method of claim 15, wherein a portion of the wafer-level underfill material layer is retained on each of the singulated integrated circuits for subsequent die stacking processing.

17. The method of claim 15, wherein laser irradiating the silicon wafer from the backside comprises using a laser beam having a wavelength greater than approximately 1000 nanometers and a laser pulse width greater than or equal to approximately 10 picoseconds.

18. The method of claim 15, wherein mechanically singulating the integrated circuits along the dicing streets comprises applying a tensile stress on the silicon wafer by stretching the dicing tape of the substrate carrier.

19. The method of claim 15, further comprising:
prior to laser irradiating the silicon wafer, laser scribing the wafer-level underfill material layer and device layers formed between the silicon wafer and the wafer-level underfill material layer, the laser scribing performed from the front side of the silicon wafer, and the laser scribing aligned with the dicing streets, wherein the laser scribing comprises using a laser having a pulse width in the femtosecond range.

20. A method of dicing a wafer, the method comprising:
providing a semiconductor wafer having integrated circuits on a front side thereof, and having a wafer-level underfill material layer disposed on the integrated circuits;
laser irradiating the semiconductor wafer from a backside of the semiconductor wafer to generate defects along dicing streets of the semiconductor wafer, the dicing streets oriented between the integrated circuits;
laser scribing the wafer-level underfill material layer from the front side of the semiconductor wafer, the laser scribing aligned with the dicing streets; and
subsequent to the laser irradiating and the laser scribing, mechanically singulating the integrated circuits along the dicing streets.

21. The method of claim 20, wherein a portion of the wafer-level underfill material layer is retained on each of the singulated integrated circuits for subsequent die stacking processing.

22. The method of claim 20, wherein providing the semiconductor wafer comprises providing a single crystalline silicon substrate.

23. The method of claim 20, wherein mechanically singulating the integrated circuits along the dicing streets comprises applying a tensile stress on the semiconductor wafer.

24. The method of claim 20, wherein the laser scribing further comprises scribing device layers formed between the semiconductor wafer and the wafer-level underfill material layer.

25. The method of claim 20, wherein the laser scribing is performed prior to the laser irradiating.

26. The method of claim 20, wherein the laser scribing comprises using a laser having a pulse width in the femtosecond range.

* * * * *